United States Patent
Costa et al.

(10) Patent No.: US 9,475,692 B2
(45) Date of Patent: Oct. 25, 2016

(54) RADIO FREQUENCY (RF) MICROELECTROMECHANICAL SYSTEMS (MEMS) DEVICES WITH GOLD-DOPED SILICON

(71) Applicant: RF Micro Devices, Inc., Greensboro, NC (US)

(72) Inventors: Julio C. Costa, Oak Ridge, NC (US); Michael Carroll, Jamestown, NC (US); Jonathan Hale Hammond, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/805,774

(22) Filed: Jul. 22, 2015

(65) Prior Publication Data
US 2016/0023892 A1    Jan. 28, 2016

Related U.S. Application Data (60) Provisional application No. 62/027,474, filed on Jul. 22, 2014.

(51) Int. Cl.
  *B81B 7/00* (2006.01)
  *H01H 1/00* (2006.01)

(52) U.S. Cl.
  CPC .......... *B81B 7/0064* (2013.01); *H01H 1/0036* (2013.01)

(58) Field of Classification Search
  CPC .............. B81B 7/0064; H01H 1/0036; H01L 2924/1461; H01L 23/585
  See application file for complete search history.

(56) References Cited

U.S. PATENT DOCUMENTS

| | | | |
|---|---|---|---|
| 4,443,810 A * | 4/1984 | Yatsuo | H01L 29/744 257/149 |
| 7,283,347 B2 * | 10/2007 | Reid, Jr. | H01G 5/18 257/E21.011 |
| 7,456,638 B2 * | 11/2008 | Bhansali | G01C 13/008 324/446 |
| 7,977,137 B1 * | 7/2011 | Ebel | B81B 7/0064 200/181 |

(Continued)

OTHER PUBLICATIONS

Ali, K. Ben et al., "RF SOI CMOS Technology on Commercial Trap-Rich High Resistivity SOI Wafer," 2012 IEEE International SOI Conference (SOI), IEEE, Oct. 1-4, 2012, Napa, CA, pp. 1-2.

(Continued)

*Primary Examiner* — Mohsen Ahmadi
(74) *Attorney, Agent, or Firm* — Withrow & Terranova, P.L.L.C.

(57) ABSTRACT

The present disclosure relates to radio frequency (RF) microelectromechanical system (MEMS) device packaging, and specifically to reducing harmonic distortion caused by such packaging. In one embodiment, a die is provided that employs a gold-doped silicon substrate, wherein at least one RF MEMS device is disposed on the gold-doped silicon substrate. By employing the gold-doped silicon substrate, the packaging can achieve an exceptionally high resistivity without any additional expensive components, wherein the high resistivity has an associated low carrier lifetime. Notably, the low carrier lifetime corresponds to reduced harmonic distortion generated by the gold-doped silicon substrate, even when operating at high power. Thus, the gold-doped silicon substrate provides a less expensive packaging in which to place RF MEMS devices, wherein the packaging is capable of operating at high power with reduced harmonic distortion.

15 Claims, 4 Drawing Sheets

(56) References Cited

U.S. PATENT DOCUMENTS

| | | | | |
|---|---|---|---|---|
| 8,349,635 | B1* | 1/2013 | Gan | G01L 9/0019 257/E23.18 |
| 2003/0020173 | A1* | 1/2003 | Huff | B81B 7/0064 257/774 |
| 2003/0230798 | A1* | 12/2003 | Lin | B81B 7/0064 257/704 |
| 2004/0009649 | A1* | 1/2004 | Kub | B82Y 30/00 438/459 |
| 2012/0153438 | A1* | 6/2012 | Harrison | H01L 29/16 257/610 |
| 2012/0175715 | A1 | 7/2012 | Hammond et al. | |
| 2013/0236881 | A1* | 9/2013 | Spatz | B81C 1/00031 435/5 |

OTHER PUBLICATIONS

Botula, A. et al., "A Thin-film SOI 180nm CMOS RF Switch Technology," 2009 IEEE Topical Meeting on Silicon Monolithic Integrated Circuits in RF Systems (SiRF '09), IEEE, Jan. 19-21, 2009, San Diego, CA, pp. 1-4.

Kerr, Daniel C. et al., "Identification of RF harmonic distortion on Si substrates and its reduction using a trap-rich layer," 2008 IEEE Topical Meeting on Silicon Monolithic Integrated Circuits in RF Systems (SiRF 2008), IEEE, Jan. 23-25, 2008, Orlando, FL, pp. 151-154.

* cited by examiner

RADIO FREQUENCY (RF) MICROELECTROMECHANICAL SYSTEMS (MEMS) DEVICES WITH GOLD-DOPED SILICON

PRIORITY APPLICATION

This application claims the benefit of U.S. Provisional Patent Application No. 62/027,474, filed Jul. 22, 2014, the disclosure of which is incorporated herein by reference in its entirety.

FIELD OF THE DISCLOSURE

The present disclosure relates to radio frequency (RF) microelectromechanical system (MEMS) device packaging, and specifically to reducing harmonic distortion caused by such packaging.

BACKGROUND

As the number of applications used for basic, everyday functions offered on mobile devices continues to increase, reliability of such applications becomes more important. Many of these applications may be categorized as high power or high sensitivity radio frequency (RF) applications, wherein using such an application is associated with relatively large power consumption. Notably, such high power or high sensitivity RF applications commonly generate distortion of RF signals, particularly in the form of harmonic distortion. This distortion of RF signals causes RF signal degradation, thus reducing the RF performance of the mobile device.

In particular, harmonic distortion may be generated by both the RF components and by the packaging (i.e., the substrate) in which such RF components are housed. Thus, one way to reduce the harmonic distortion is by employing RF microelectromechanical systems (MEMS) devices as the RF components in the mobile device. RF MEMS devices, such as tunable capacitors and metal contact switches, are passive devices with moving mechanical elements that deliver the desired electrical function. Notably, RF MEMS devices typically generate very low levels of signal distortion, and thus, may reduce the overall harmonic distortion of a high power or high sensitivity RF application.

However, even when employing RF MEMS devices, the substrate on which such RF MEMS devices are manufactured or under which they are capped generates harmonic distortion that can significantly contribute to overall RF distortion. While methods exist to mitigate or reduce the harmonic distortion generated by the substrate, such methods have tradeoffs. For example, one method to reduce the harmonic distortion associated with the substrate is to include metal shielding that separates RF signals from the substrate. While such metal shielding may reduce the RF distortion to a desired level, the metal shielding may introduce loss or static ground capacitance, which reduces overall RF performance. Additionally, methods such as metal shielding are typically expensive to implement.

Accordingly, there is a need for a less expensive alternative for packaging RF MEMS devices that is capable of operating at high power with reduced harmonic distortion attributable to the package.

SUMMARY

The present disclosure relates to radio frequency (RF) microelectromechanical system (MEMS) device packaging, and specifically to reducing harmonic distortion caused by such packaging. In one embodiment, a die is provided that employs a gold-doped silicon substrate, wherein at least one RF MEMS device is disposed on the gold-doped silicon substrate. By employing the gold-doped silicon substrate, the packaging can achieve an exceptionally high resistivity without any additional expensive components, wherein the high resistivity has an associated low carrier lifetime. Notably, the low carrier lifetime corresponds to reduced harmonic distortion generated by the gold-doped silicon substrate, even when operating at high power. Thus, the gold-doped silicon substrate provides a less expensive packaging in which to place RF MEMS devices, wherein the packaging is capable of operating at high power with reduced harmonic distortion.

In one embodiment, a die is provided that includes a substrate, wherein at least one RF MEMS device is disposed on the substrate. The die also includes a cap wafer that is comprised of gold-doped silicon and is coupled to the substrate. Further, the cap wafer extends over the at least one RF MEMS device to form a cavity in which the at least one RF MEMS device resides. Because the cap wafer is comprised of gold-doped silicon, the packaging can achieve an exceptionally high resistivity without any additional expensive components. Thus, dies employing a cap wafer comprised of gold-doped silicon also provide a less expensive packaging in which to place RF MEMS devices that is capable of operating at high power with reduced harmonic distortion attributable to the packaging.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to radio frequency (RF) microelectromechanical system (MEMS) device packaging, and specifically to reducing harmonic distortion caused by such packaging. In one embodiment, a die is provided that employs a gold-doped silicon substrate, wherein at least one RF MEMS device is disposed on the gold-doped silicon substrate. By employing the gold-doped silicon substrate, the packaging can achieve an exceptionally high resistivity without any additional expensive components, wherein the high resistivity has an associated low carrier lifetime. Notably, the low carrier lifetime corresponds to reduced harmonic distortion generated by the gold-doped silicon substrate, even when operating at high power. Thus, the gold-doped silicon substrate provides a less expensive packaging in which to place RF MEMS devices, wherein the packaging is capable of operating at high power with reduced harmonic distortion.

Figure 1:
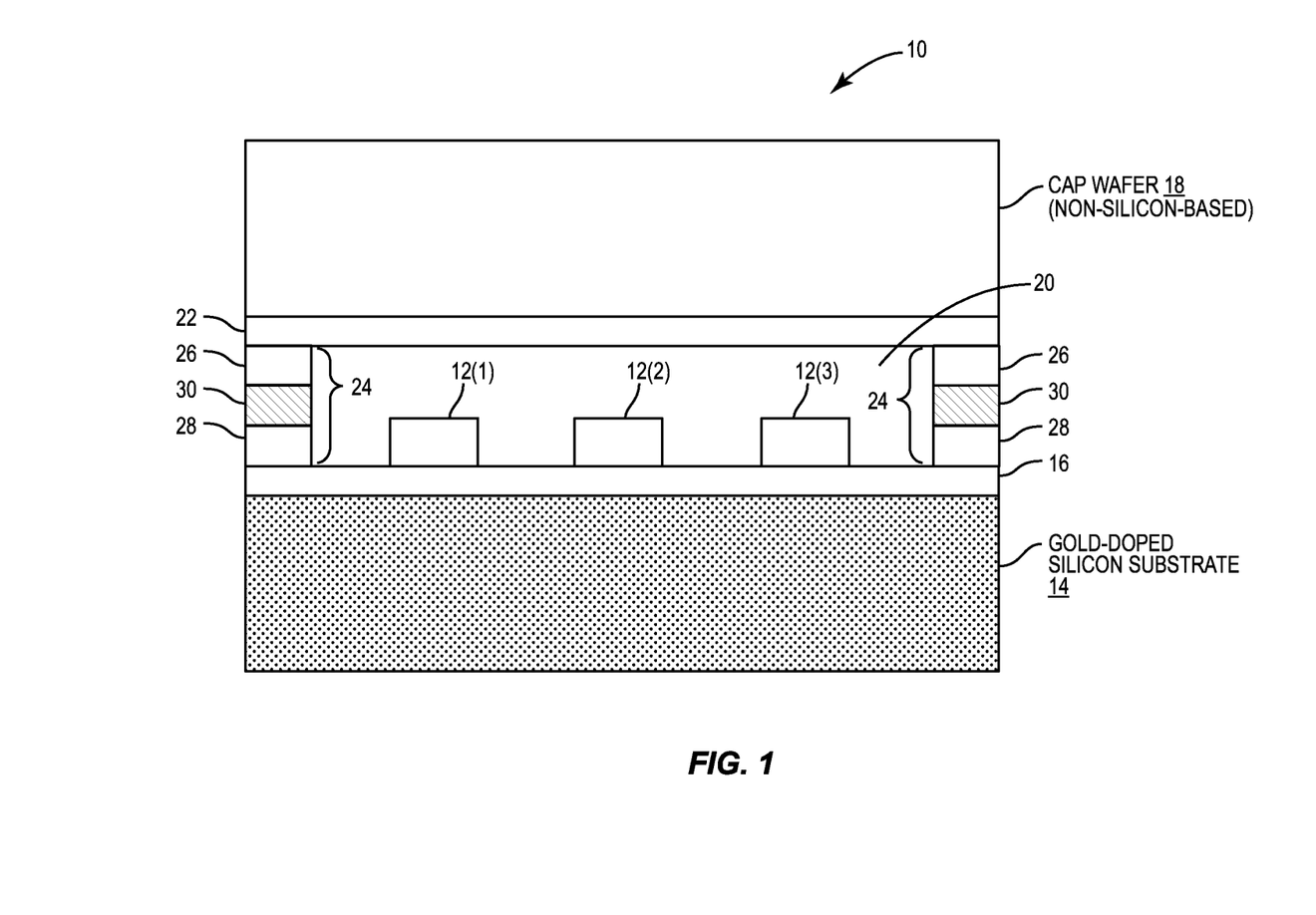
FIG. 1 shows a cross-sectional view of a die employing radio frequency (RF) microelectromechanical system (MEMS) devices with a gold-doped silicon substrate and a non-silicon-based cap wafer.

FIG. 1 shows a cross-sectional view of a die 10 employing RF MEMS devices 12(1)-12(3) with a gold-doped silicon substrate 14. The die 10 includes a substrate passivation layer 16 directly on top of the gold-doped silicon substrate 14, wherein the RF MEMS devices 12(1)-12(3) are formed on the substrate passivation layer 16. Notably, alternative embodiments may not include the substrate passivation layer 16 such that the RF MEMS devices 12(1)-12(3) are formed directly on the gold-doped silicon substrate 14. Additionally, the die 10 includes a cap wafer 18 that is coupled to the gold-doped silicon substrate 14, wherein the cap wafer 18 extends over the RF MEMS devices 12(1)-12-(3) such that a cavity 20 is formed wherein the RF MEMS devices 12(1)-12(3) reside. Notably, in this embodiment, the cap wafer 18 is made of a non-silicon-based material, such as, but not limited to, glass, Gallium-Arsenide (GaAs), Gallium Nitride (GaN), sapphire, polymer, or like material.

Further, a cap passivation layer 22 is formed directly on the bottom of the cap wafer 18 such that the cap passivation layer 22 is adjacent to the RF MEMS devices 12(1)-12(3). Notably, alternative embodiments may not include the cap passivation layer 22. The die 10 also includes a pedestal structure 24 that couples the gold-doped silicon substrate 14 to the cap wafer 18 and creates the cavity 20 that spaces the gold-doped silicon substrate 14 from the cap wafer 18. Notably, although the pedestal structure 24 is illustrated in FIG. 1 in two separate locations, the pedestal structure 24 in this embodiment is one structure employed as a ring around the perimeter of the gold-doped silicon substrate 14 and the cap wafer 18, thus enclosing the RF MEMS devices 12(1)-12(3) in the cavity 20.

The pedestal structure 24 includes a cap pedestal ring 26, a substrate pedestal ring 28, and a bonding layer 30. In this manner, the cap pedestal ring 26 couples to the cap passivation layer 22 while the substrate pedestal ring 28 couples to the substrate passivation layer 16. In embodiments that do not include the substrate passivation layer 16, the substrate pedestal ring 28 is coupled directly to the gold-doped silicon substrate 14. Similarly, in embodiments that do not include the cap passivation layer 22, the cap pedestal ring 26 is coupled directly to the cap wafer 18. The bonding layer 30 is bonded to the cap pedestal ring 26 and the substrate pedestal ring 28, thereby coupling the cap wafer 18 to the gold-doped silicon substrate 14. Such bonding may be achieved with a bonding method known in the art, such as, but not limited to, electrical-based, chemical-based, interfacial material-based, or high temperature bonding. Notably, alternative embodiments may not include the pedestal structure 24. In such embodiments, the cavity 20 may be formed by etching the cavity 20 from the cap wafer 18, and the cap wafer 18 may be directly coupled to the substrate passivation layer 16 using a bonding method, such as plasma-based bonding.

As discussed above, some packages designed to house RF MEMS devices, such as the RF MEMS devices 12(1)-12(3), are capable of generating harmonic distortion while operating at high power due to the lack of resistivity of the package itself. As will be appreciated by those of ordinary skill in the art, doping silicon with gold results in a material with a high propensity for trapping charge carriers, resulting in a material with a low carrier lifetime and a high resistivity. Accordingly, the gold-doped silicon substrate 14 in this embodiment is doped with gold at a concentration of greater than about $1 \times 10^{15}$ cm$^{-3}$. Such a doping concentration increases the resistivity of the gold-doped silicon substrate 14 to a level high enough to reduce the carrier lifetime, and thus, reduce harmonic distortion associated with the gold-doped silicon substrate 14. Notably, additional embodiments may dope the gold-doped silicon substrate 14 at a concentration between about $1 \times 10^{15}$ cm$^{-3}$ and $1 \times 10^{17}$ cm$^{-3}$ so as to achieve a resistivity of about 10,000 ohm-cm, provided that the concentration of gold is greater than the concentration of any other impurities. It is worth noting that doping the gold-doped silicon substrate 14 at the concentrations previously described increases the resistivity of the package to a high enough level to reduce the harmonic distortion associated with the gold-doped silicon substrate 14, even though the cap wafer 18 in this embodiment is not formed from gold-doped silicon.

Further, the die 10 may be sized so as to conform to design requirements of a particular application. For a non-limiting example, the die 10 may be between 200 micro-meters (μm) and 1500 μm thick. The gold-doped silicon substrate 14 and the cap wafer 18 may each be between about 100 μm and 700 μm thick, wherein the gold-doped silicon substrate 14 and the cap wafer 18 may be formed on wafers between about 150 millimeters (mm) and 300 mm in diameter. Notably, the gold-doped silicon substrate 14 and the cap wafer 18 each may begin with a thickness of about 700 μm, wherein the gold-doped silicon substrate 14 and/or the cap wafer 18 may be put through a thinning process such that the die 10 may have a thickness based on a total height requirement of a desired RF MEMS solution.

Additionally, the substrate passivation layer 16 and cap passivation layer 22 each may be any suitable passivation layer, and may comprise materials such as, but not limited to, silicon oxide, silicon nitride, and aluminum oxide. The substrate passivation layer 16 and cap passivation layer 22 each may be between about 0.1 μm and 5 μm thick. Further, the pedestal structure 24 may be between about 1 μm and 50 μm thick, thus forming the cavity 20 between about 1 μm and 50 μm thick. The thickness of the pedestal structure 24 depends, in part, on the bonding method chosen for the bonding layer 30. Notably, although not illustrated in FIG. 1, the die 10 may include one or more vias in the gold-doped silicon substrate 14. Such vias may be configured to electrically couple the RF MEMS devices 12(1)-12(3) to other components, contact pads, or metal traces on a side of the gold-doped silicon substrate 14 that is opposite of the RF MEMS devices 12(1)-12(3).

Figure 2:
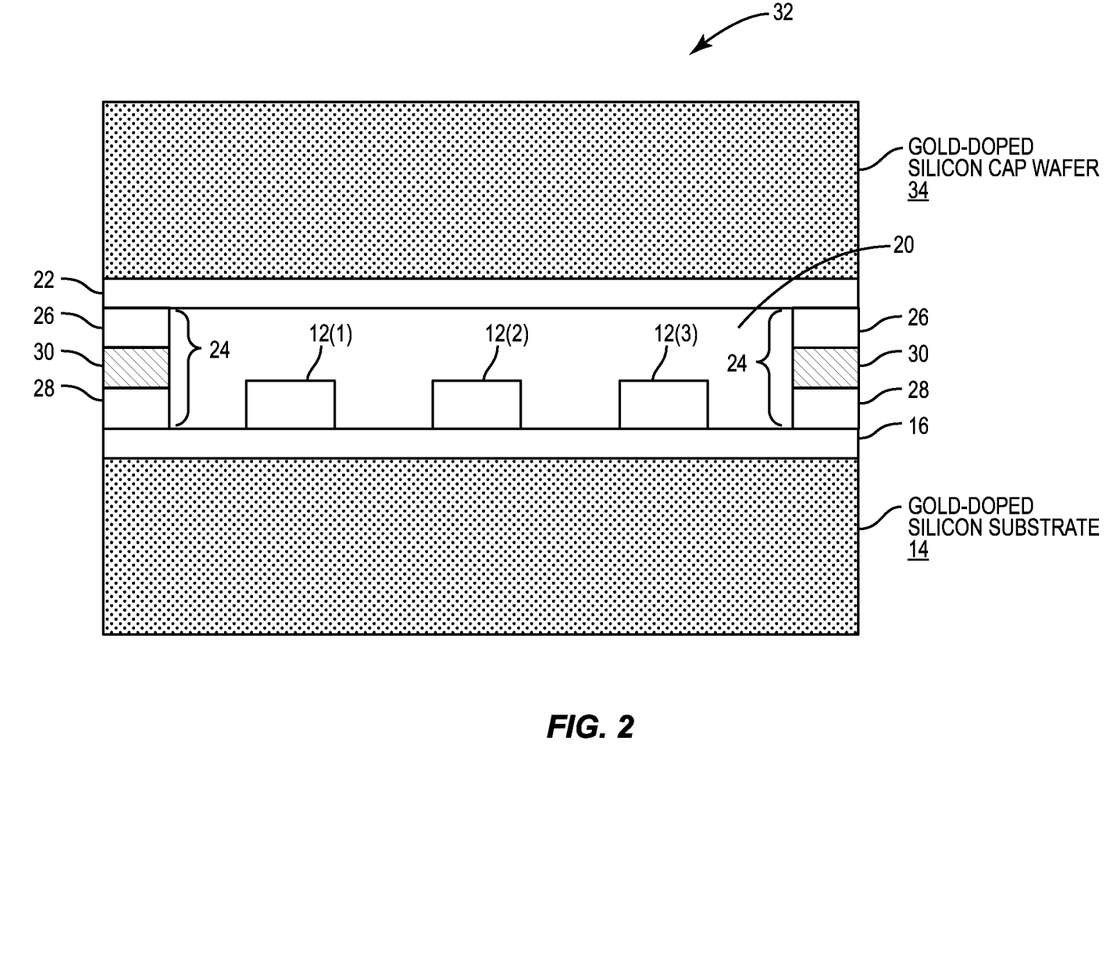
FIG. 2 shows a cross-sectional view of a die employing RF MEMS devices with a gold-doped silicon substrate and a gold-doped silicon cap wafer.

In addition to the embodiment provided in FIG. 1, other embodiments may be employed to reduce harmonic distortion caused by RF MEMS device packaging. FIG. 2 shows a cross-sectional view of a die 32 employing the RF MEMS devices 12(1)-12(2) with the gold-doped silicon substrate 14. The die 32 includes certain components in common with the die 10 in FIG. 1. Such components have the same number in FIG. 2 as in FIG. 1, and thus will not be re-described herein.

Notably, unlike the non-silicon-based cap wafer 18 in FIG. 1, the die 32 employs a cap wafer 34 formed from gold-doped silicon (also referred to as the "gold-doped silicon cap wafer 34"). In this manner, the cap wafer 34 is coupled to the gold-doped silicon substrate 14 using the pedestal structure 24, wherein the cap wafer 34 extends over the RF MEMS devices 12(1)-12(3) such that the cavity 20 is formed wherein the RF MEMS devices 12(1)-12(3) reside. By employing the cap wafer 34 formed from gold-doped silicon in conjunction with the gold-doped silicon substrate 14, the packaging of the die 32 can achieve an exceptionally high resistivity, thereby reducing harmonic distortion associated with the package. In this manner, the cap wafer 34 and the gold-doped silicon substrate 14 in this embodiment are doped with gold at a concentration of greater than about $1 \times 10^{15}$ cm$^{-}$. As previously described, such a doping concentration increases the resistivity of the cap wafer 34 and the gold-doped silicon substrate 14 to a level high enough to reduce the carrier lifetime, and thus, reduce associated harmonic distortion. Additional embodiments may dope the cap wafer 34 and the gold-doped silicon substrate 14 each at a concentration between about $1 \times 10^{15}$ cm$^{-3}$ and $1 \times 10^{17}$ cm$^{-3}$ so as to achieve a resistivity of about 10,000 ohm-cm, provided that the concentration of gold is greater than the concentration of any other impurities.

Figure 3:
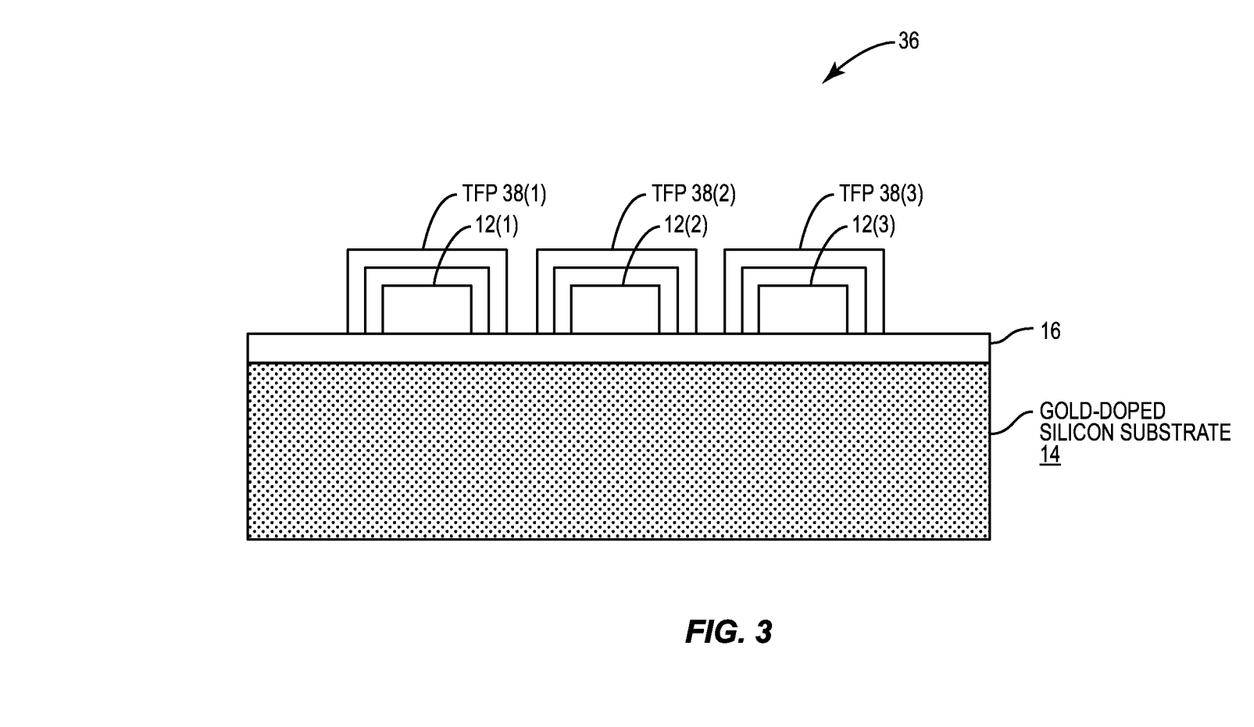
FIG. 3 shows a cross-sectional view of a die employing RF MEMS devices with a gold-doped silicon substrate and thin-film packages.

Additionally, FIG. 3 shows a cross-sectional view of a die 36 employing the RF MEMS devices 12(1)-12(3) with the gold-doped silicon substrate 14. The die 36 includes certain components in common with the die 10 in FIG. 1. Such components have the same number in FIG. 3 as in FIG. 1, and thus will not be re-described herein.

However, rather than employing a cap wafer to enclose the RF MEMS devices 12(1)-12(3), such as the cap wafers 18 and 34 in FIGS. 1 and 2, respectively, the die 36 includes thin-film packages (TFPs) 38(1)-38(3) formed on the substrate passivation layer 16 and over the corresponding RF MEMS devices 12(1)-12(3). The TFPs 38(1)-38(3) may be employed instead of a cap wafer such as the cap wafers 18, 34 in FIGS. 1 and 2, respectively, wherein the TFPs 38(1)-38(3) may be less expensive and lead to a potentially simpler RF solution when employing flip-chip packaging. Notably, embodiments that do not include the substrate passivation layer 16 may include the TFPs 38(1)-38(3) formed directly on the gold-doped silicon substrate 14. Similar to the die 10 in FIG. 1, the gold-doped silicon substrate 14 in the die 36 is doped with gold at a concentration of greater than about $1 \times 10^{15}$ cm$^{-3}$. Thus, the resistivity of the gold-doped silicon substrate 14 is increased to a level high enough to reduce the carrier lifetime, thereby reducing harmonic distortion associated with the gold-doped silicon substrate 14. Also similar to the die 10, additional embodiments of the die 36 may dope the gold-doped silicon substrate 14 at a concentration between about $1 \times 10^{15}$ cm$^{-3}$ and $1 \times 10^{17}$ cm$^{-3}$ so as to achieve a resistivity of about 10,000 ohm-cm, provided that the concentration of gold is greater than the concentration of any other impurities. Additional information on the TFPs 38(1)-38(3) may be found in U.S. patent application Ser. No. 13/348,277, which is incorporated herein by reference.

Figure 4:
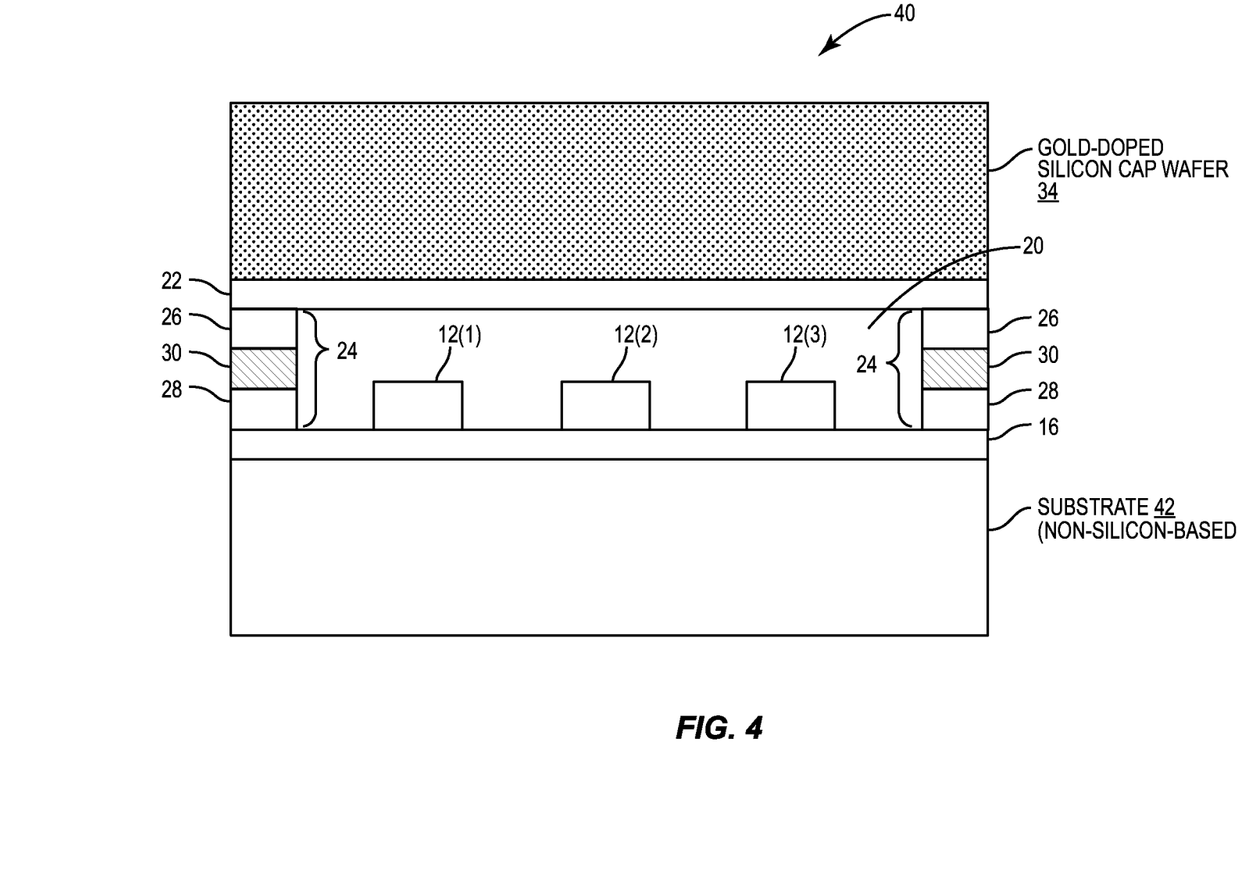
FIG. 4 shows a cross-sectional view of a die employing RF MEMS devices with a non-silicon-based substrate and a gold-doped silicon cap wafer.

FIG. 4 shows a cross-sectional view of a die 40 employing the RF MEMS devices 12(1)-12(3) with a substrate 42. The die 40 includes certain components in common with the die 10 in FIG. 1. Such components have the same number in FIG. 4 as in FIG. 1, and thus will not be re-described herein.

However, rather than being formed from gold-doped silicon, the substrate 42 is formed from a non-silicon-based material, such as glass, GaAs, or sapphire. Thus, to achieve higher resistivity in the package of the die 40 such that harmonic distortion associated with the package is reduced in the absence of a gold-doped silicon substrate, the die 40 includes the cap wafer 34 formed from gold-doped silicon as previously described in relation to FIG. 2. In this manner, the cap wafer 34 is coupled to the substrate 42 using the pedestal structure 24, wherein the cap wafer 34 extends over the RF MEMS devices 12(1)-12(3) such that the cavity 20 is formed wherein the RF MEMS devices 12(1)-12(3) reside. Further, as previously described, the cap wafer 34 is doped with gold at a concentration of greater than about $1 \times 10^{15}$ cm$^{-3}$. Additional embodiments may dope the cap wafer 34 at a concentration between about $1 \times 10^{15}$ cm$^{-3}$ and $1 \times 10^{17}$ cm$^{-3}$ so as to achieve a resistivity of about 10,000 ohm-cm, provided that the concentration of gold is greater than the concentration of any other impurities.

Those skilled in the art will recognize improvements and modifications to the embodiments of the present disclosure. All such improvements and modifications are considered within the scope of the concepts disclosed herein and the claims that follow.

What is claimed is:
1. A die comprising:
a gold-doped silicon substrate;
at least one radio frequency (RF) microelectromechanical system (MEMS) device on the gold-doped silicon substrate;

a cap wafer that is coupled to the gold-doped silicon substrate and extends over the at least one RF MEMS device to form a cavity in which the at least one RF MEMS device resides; and a pedestal structure that couples the cap wafer to the gold-doped silicon substrate to form the cavity in which the at least one RF MEMS device resides, wherein the pedestal structure comprises a plurality of stacked layers.

2. The die of claim 1 wherein a doping concentration of gold in the gold-doped silicon substrate is greater than about $1 \times 10^{15}$ cm$^{-3}$.

3. The die of claim 1 wherein a doping concentration of gold in the gold-doped silicon substrate is between about $1 \times 10^{15}$ cm$^{-3}$ and $1 \times 10^{17}$ cm$^{-3}$.

4. The die of claim 1 where the at least one RF MEMS device is formed directly on the gold-doped silicon substrate.

5. The die of claim 1 further comprising a substrate passivation layer directly on the gold-doped silicon substrate wherein the at least one RF MEMS device is formed on the substrate passivation layer.

6. The die of claim 5 wherein a doping concentration of gold in the gold-doped silicon substrate is greater than about $1 \times 10^{15}$ cm$^{-3}$.

7. The die of claim 1 wherein the cap wafer comprises gold-doped silicon.

8. The die of claim 7 wherein a doping concentration of gold in the cap wafer is greater than about $1 \times 10^{15}$ cm$^{-3}$.

9. The die of claim 8 wherein the doping concentration of gold in the cap wafer is between about $1 \times 10^{15}$ cm$^{-3}$ and $1 \times 10^{17}$ cm$^{-3}$.

10. The die of claim 9 wherein the doping concentration of gold in the gold-doped silicon substrate is greater than about $1 \times 10^{15}$ cm$^{-3}$.

11. The die of claim 10 wherein the doping concentration of gold in the gold-doped silicon substrate is between about $1 \times 10^{15}$ cm$^{-3}$ and $1 \times 10^{17}$ cm$^{-3}$.

12. The die of claim 7 wherein the cap wafer is not silicon-based.

13. The die of claim 7 further comprising a cap passivation layer directly on a surface of the cap wafer adjacent to the at least one RF MEMS device.

14. The die of claim 13 further comprising a substrate passivation layer directly on the gold-doped silicon substrate wherein the at least one RF MEMS device is formed on the substrate passivation layer.

15. A die comprising:

a gold-doped silicon substrate;

at least two radio frequency (RF) microelectromechanical system (MEMS) devices on the gold-doped silicon substrate; and at least one at least two thin-film packages (TFPs) wherein:

each of the at least two TFPs is formed on the gold-doped silicon substrate and over a corresponding RF MEMS device of the at least two RF MEMS devices to form a cavity between each of the at least two TFPs and the corresponding RF MEMS device; and a doping concentration of gold in the gold-doped silicon substrate is greater than about $1 \times 10^{15}$ cm$^{-3}$.

* * * * *

UNITED STATES PATENT AND TRADEMARK OFFICE
CERTIFICATE OF CORRECTION

PATENT NO.       : 9,475,692 B2                                                      Page 1 of 1
APPLICATION NO.  : 14/805774
DATED            : October 25, 2016
INVENTOR(S)      : Julio C. Costa, Michael Carroll and Jonathan Hale Hammond It is certified that error appears in the above-identified patent and that said Letters Patent is hereby corrected as shown below:

In the Specification:

In column 5, line 56, replace "$1 \times 10^{15}$ cm⁻" with --$1 \times 10^{15}$ cm$^{-3}$--.

Signed and Sealed this
Thirteenth Day of December, 2016

Michelle K. Lee
*Director of the United States Patent and Trademark Office*